(12) United States Patent
Narikawa

(10) Patent No.: US 10,859,601 B2
(45) Date of Patent: Dec. 8, 2020

(54) DEVICE INSPECTION CIRCUIT, DEVICE INSPECTION DEVICE, AND PROBE CARD

(71) Applicant: TOKYO ELECTRON LIMITED, Tokyo (JP)

(72) Inventor: Kenichi Narikawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 109 days.

(21) Appl. No.: 16/324,733

(22) PCT Filed: Jun. 6, 2017

(86) PCT No.: PCT/JP2017/021556
§ 371 (c)(1),
(2) Date: Feb. 11, 2019

(87) PCT Pub. No.: WO2018/029971
PCT Pub. Date: Feb. 15, 2018

(65) Prior Publication Data
US 2019/0178913 A1    Jun. 13, 2019

(30) Foreign Application Priority Data

Aug. 12, 2016   (JP) .................................. 2016-158906

(51) Int. Cl.
*G01R 1/20* (2006.01)
*G01R 31/26* (2020.01)
(Continued)

(52) U.S. Cl.
CPC ......... *G01R 1/203* (2013.01); *G01R 1/07342* (2013.01); *G01R 19/00* (2013.01);
(Continued)

(58) Field of Classification Search
None
See application file for complete search history.

(56) References Cited

U.S. PATENT DOCUMENTS

| 6,563,352 B1 * | 5/2003 | Gohel | G01R 31/31924 |
| | | | 326/56 |
| 2017/0256324 A1 * | 9/2017 | Kagami | G11C 29/56012 |

FOREIGN PATENT DOCUMENTS

| JP | H6-41174 Y2 | 10/1994 |
| JP | H7-297242 A | 11/1995 |

(Continued)

*Primary Examiner* — Paresh Patel
(74) *Attorney, Agent, or Firm* — Nath, Goldberg & Meyer; Jerald L. Meyer

(57) ABSTRACT

There is provided a device inspection circuit capable of measuring currents flowing through a plurality of devices without increasing the cost. A power supply circuit of a box-side inspection circuit includes an operational amplifier and a sense resistor. A power source having a current measuring function, the operational amplifier, the sense resistor and a DUT are connected in series in this order. The power source is connected to a non-inverting input terminal of the operational amplifier. The power supply circuit further includes a negative feedback channel configured to apply a voltage between the sense resistor and the DUT to an inverting input terminal of the operational amplifier, and a positive feedback channel configured to connect an upstream sense point between the operational amplifier and the sense resistor and the non-inverting input terminal of the operational amplifier. The positive feedback channel includes a feedback resistor installed therein.

9 Claims, 7 Drawing Sheets

(51) Int. Cl.
*G01R 19/00* (2006.01)
*G01R 31/28* (2006.01)
*G01R 1/073* (2006.01)

(52) U.S. Cl.
CPC .............. *G01R 31/26* (2013.01); *G01R 31/28* (2013.01); *G01R 31/2831* (2013.01)

(56) References Cited

FOREIGN PATENT DOCUMENTS

| JP | 11153641 A | 6/1999 |
| JP | 2001222329 A | 8/2001 |
| JP | 2016-35957 A | 3/2016 |
| KR | 1020080050424 A | 6/2008 |

\* cited by examiner

DEVICE INSPECTION CIRCUIT, DEVICE INSPECTION DEVICE, AND PROBE CARD

This is a National Phase Application filed under 35 U.S.C. 371 as a national stage of PCT/JP2017/021556, filed Jun. 6, 2017, an application claiming the benefit of Japanese Application No. 2016-158906, filed Aug. 12, 2016, the content of each of which is hereby incorporated by reference in its entirety.

TECHNICAL FIELD

The present disclosure relates to a device inspection circuit, a device inspection device, and a probe card for inspecting a semiconductor device formed on a substrate.

BACKGROUND

A prober has been developed to detect a defect or the like at an initial stage in the manufacturing process of a semiconductor device. The prober is a device inspection device for inspecting a semiconductor device formed on a semiconductor wafer (hereinafter, simply referred to as a "wafer") as a substrate without cutting out the semiconductor device from the wafer.

The prober includes a probe card equipped with a plurality of pin-like probes, and a stage which freely moves upward, downward, leftward and rightward with the wafer mounted thereon. Each probe of the probe card is brought into contact with electrode pads or solder bumps of the semiconductor device to be inspected (device under test, hereinafter, referred to as a "DUT"). Signals obtained from the DUT are sent to an LSI tester installed on the prober, thereby inspecting electrical characteristics of the DUT (see, for example, Patent Document 1).

In particular, from the viewpoint of improving the inspection efficiency and enhancing throughput, a prober has been developed which simultaneously inspects electrical characteristics of a plurality of DUTs formed on a wafer. In such a prober, generally, as illustrated in FIG. 10, a plurality of power sources 101, each of which supplies electric power to the respective DUT 100, is installed in a one-to-one relationship with the DUTs 100.

In recent years, from the viewpoint of an increase in diameter of the wafer and an improvement in production efficiency of the semiconductor device, the number of DUTs formed on the wafer tends to be greatly increased. As an example, there is a case where the number of DUTs exceeds 1,000. In this case, the installation of the power sources 101 in the prober to correspond to the respective DUTs 100 is difficult due to layout limitations inside the prober. This increases the cost of the prober. In addition, there is a case where the power source 101 is installed in the LSI tester. However, even in this case, the installation of the power source 101 in the LSI tester to correspond to the respective DUT 100 is difficult due to layout limitations inside the LSI tester. This increases the cost of the LSI tester.

In this regard, as illustrated in FIG. 11, supplying electric power from a single power source 101 to a plurality of DUTs 100 is under consideration. In this case, in order to control the electric power supplied to each DUT 100, power supply circuits 102 are installed to correspond to the DUTs 100, respectively. However, the electric power supplied to each DUT 100 is insufficient so that a voltage applied to each DUT 100 may be lowered. For this reason, the power supply circuit 102 includes an operational amplifier for amplifying the electric power supplied from the single power source 101.

Meanwhile, in the related art, a current (hereinafter, referred to as a "device current") flowing through the DUT 100 is equal to a current flowing through the power source 101. Thus, the current flowing through the power source 101 is measured as the device current using a current measuring function of the power source 101. In the case where the power supply circuit 102 is installed, the operational amplifier is interposed between the power source 101 and the DUT 100. As a result, the device current and the current flowing through the power source 101 are not equal. Therefore, in the power supply circuit 102, it is necessary to directly measure a current flowing from the operational amplifier 103 toward the DUT 100 using a sense amplifier 104 and an AD converter 105 arranged between the operational amplifier 103 and the DUT 100, as illustrated in FIG. 12.

PRIOR ART DOCUMENTS

Patent Documents

Patent Document 1: Japanese laid-open publication No. H7-297242

However, it is necessary to install the sense amplifier 104 and the AD converter 105 to correspond to each DUT 100. In the case where the number of DUTs formed on the wafer exceeds 1,000 as described above, it is required to install each of the sense amplifiers 104 and the AD converters 105 by the number of the number of DUTs. Such an installation is difficult due to the layout limitations in the prober. As a result, it is difficult to measure currents flowing through the plurality of DUTs. In addition, the presence of the plurality of sense amplifiers 104 and the plurality of AD converters 105 causes a problem of increasing the cost of the prober.

SUMMARY

The present disclosure provides some embodiments of a device inspection circuit, a device inspection device, and a probe card, which are capable of measuring currents flowing through a plurality of devices without increasing the cost.

According to one embodiment of the present disclosure, there is provided a device inspection circuit which includes at least one power source having a current measuring function, an operational amplifier and a first resistor, wherein the at least one power source, the operational amplifier, the first resistor and at least one device are connected in series in this order, and the at least one power source is connected to a non-inverting input terminal of the operational amplifier, the device inspection circuit further including: a first feedback channel configured to apply a voltage between the first resistor and the at least one device to an inverting input terminal of the operational amplifier; and a second feedback channel configured to connect a point between the operational amplifier and the first resistor and the non-inverting input terminal of the operational amplifier, wherein the second feedback channel includes a second resistor installed therein.

According to the present disclosure, a voltage between a first resistor and a device is applied to an inverting input terminal of an operational amplifier. Thus, a potential of a non-inverting input terminal of the operational amplifier becomes equal to a potential between the first resistor and the device by a negative feedback operation of the operational amplifier. In addition, a second feedback channel connects a point between the operational amplifier and the first resistor and the non-inverting input terminal of the operational amplifier. Thus, a voltage drop value at the second feedback channel becomes equal to a voltage drop value at the first resistor. Furthermore, a current flowing through the second feedback channel can be measured using a current measuring function of the power source. Therefore, according to Ohm's law, a current flowing through the first resistor can be calculated based on currents flowing through the first resistor, the second resistor and the second feedback channel. As a result, it is possible to calculate the current flowing from the first resistor to each device without installing a sense amplifier and an AD converter that correspond to each device. That is to say, it is possible to measure currents flowing through a plurality of devices without increasing the cost.

DETAILED DESCRIPTION

Embodiments of the present disclosure will now be described in detail with reference to the accompanying drawings.

First, a first embodiment of the present disclosure will be described.

Figure 1:
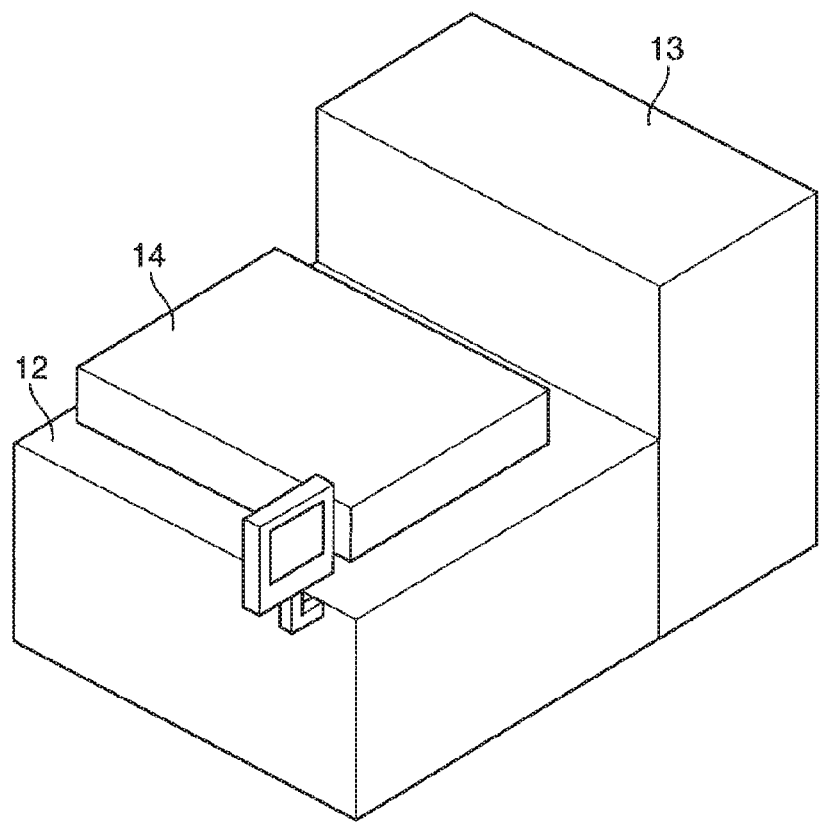
FIG. 1 is a perspective view schematically illustrating a configuration of a prober as a device inspection device according to a first embodiment of the present disclosure.
Figure 2:
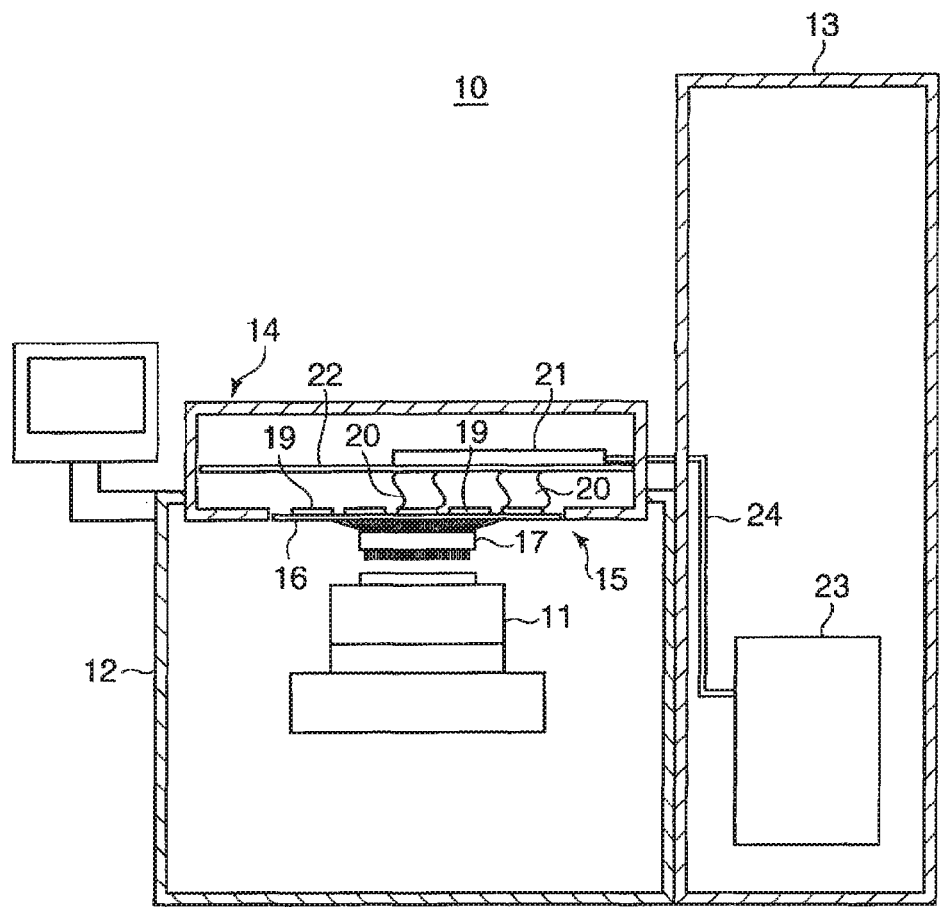
FIG. 2 is a front view schematically illustrating the configuration of the prober of FIG. 1.

FIG. 1 is a perspective view schematically illustrating a configuration of a prober as a device inspection device according to the present embodiment, and FIG. 2 is a front view of the prober. FIG. 2 is drawn as a partial cross-sectional view, in which components incorporated in a main body 12, a loader 13 and a test box 14, which will be described later, are shown.

Figure 3:
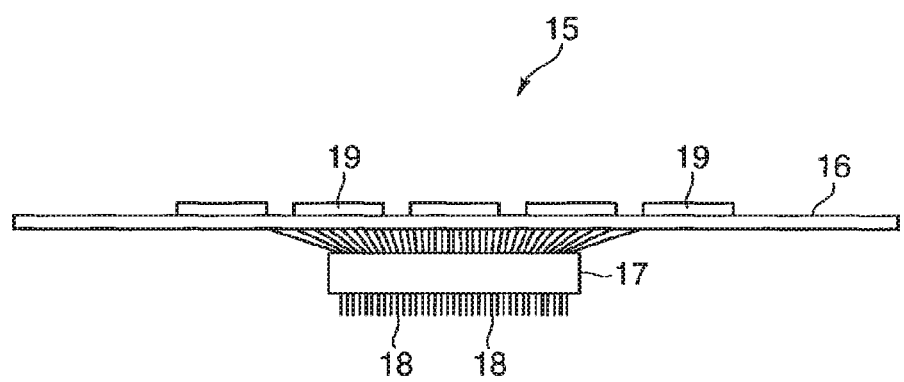
FIG. 3 is an enlarged front view illustrating a configuration of a probe card of FIG. 2.

In FIGS. 1 and 2, a prober 10 includes the main body 12 incorporating a stage 11 on which a wafer W is mounted, the loader 13 arranged adjacent to the main body 12, the test box 14 arranged so as to cover the main body 12. The prober simultaneously inspects electrical characteristics of a plurality of DUTs formed on the wafer W. The main body 12 has the shape of a housing whose interior is hollow. In the interior of the main body 12, a probe card 15 is arranged so as to face the stage 11 in addition to the stage 11 described above. The probe card 15 faces the wafer W. The probe card 15 includes a plate-shaped card board 16, and a probe head 17 arranged on a lower surface of the card board 16, which faces the wafer W. As illustrated in FIG. 3, the probe head 17 includes a plurality of needle-like probes 18 corresponding to electrode pads or solder bumps of each DUT formed on the wafer W.

The wafer W is fixed to the stage 11 so that a relative position of the wafer W to the stage 11 does not deviate. The stage 11 is movable in a horizontal direction and a vertical direction so that the electrode pads or solder bumps of each DUT are accurately brought into contact with each probe 18 of the probe head 17 by adjusting the relative position of the probe card 15 and the wafer W. The loader 13 takes out the wafer W, on which the plurality of DUTs is formed, from a FOUP (not shown) as a transfer container, and mounts the same on the stage 11 inside the main body 12. Card-side inspection circuits 19 are formed on the card board 16 of the probe card 15 (see FIG. 3), and are connected to the probe head 17.

The test box 14 includes a harness 20 as a wire and a test board 22 on which a box-side inspection circuit 21 (device inspection circuit) is formed. The harness 20 connects the test board 22 of the test box 14 and the card board 16 of the probe card 15. In the prober 10, a portion of a circuit configuration of a mother board on which a semiconductor device is installed is reproduced by the card-side inspection circuit 19 and the box-side inspection circuit 21. The loader 13 is provided with a base unit 23 including a power source, a controller and a simple measurement module. The base unit 23 is coupled to the box-side inspection circuit 21 by a wiring 24. The controller instructs the box-side inspection circuit 21 to start inspection of the electrical characteristics of the DUT.

When inspecting the electrical characteristics of the DUT, the box-side inspection circuit 21 supplies electric power to each DUT via the card-side inspection circuit 19 and the probe card 15 and transmits data to the card-side inspection circuit 19. In addition, the box-side inspection circuit 21 determines whether or not the transmitted data has been correctly processed by the card-side inspection circuit 19 connected to each DUT based on an electronic signal provided from the card-side inspection circuit 19.

Figure 4:
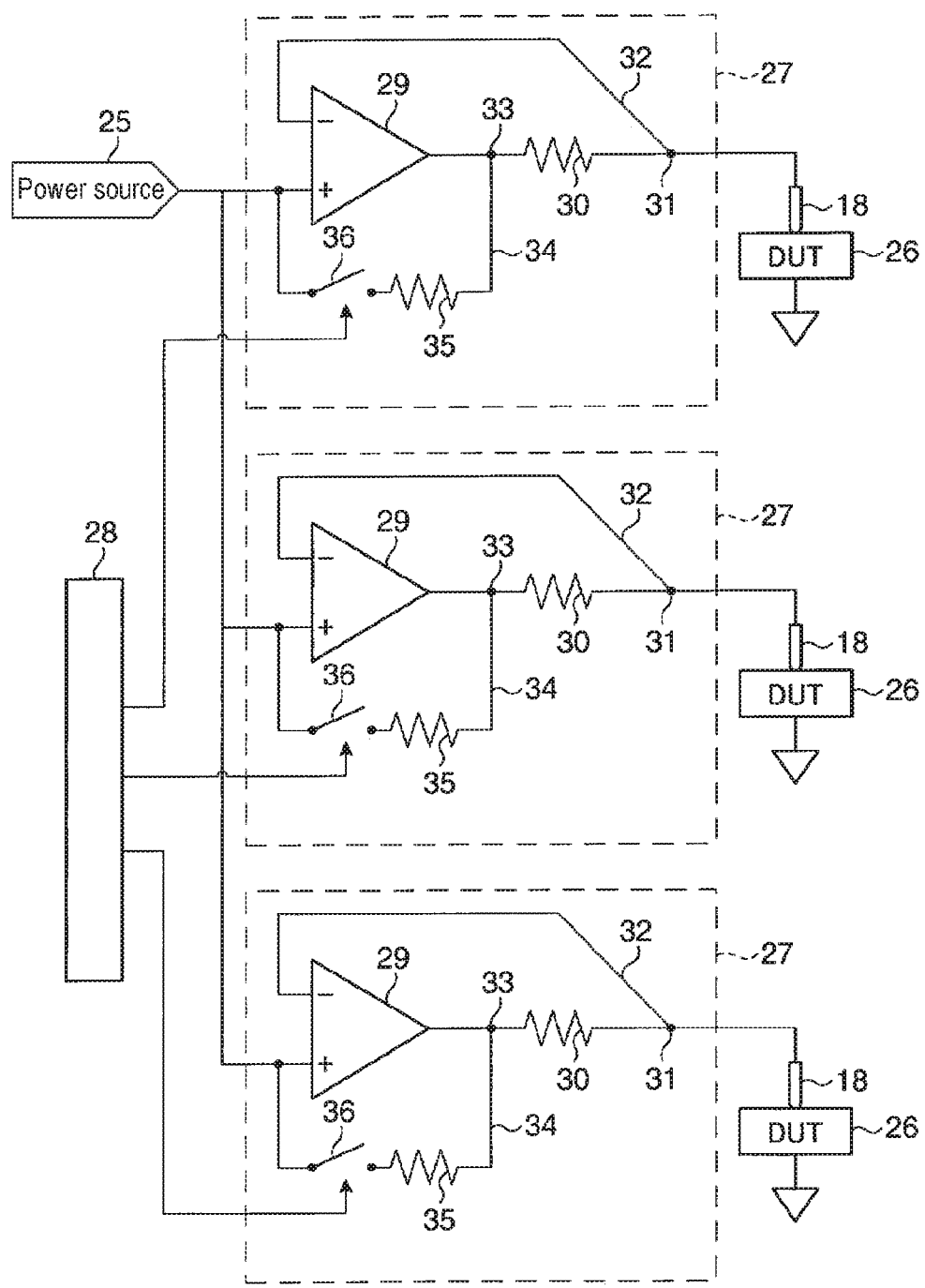
FIG. 4 is a circuit diagram illustrating a configuration of a box-side inspection circuit in FIG. 2.

FIG. 4 is a circuit diagram illustrating a configuration of the box-side inspection circuit in FIG. 2. In FIG. 4, only components related to the supply of electric power are illustrated.

In FIG. 4, the box-side inspection circuit 21 includes a power source 25 having a function of measuring current, a plurality of power supply circuits 27 connected to respective DUTs 26 formed on the wafer W in a one-to-one relationship, and a switch control part 28. The power source 25 is branched and connected to the plurality of power supply circuits 27 so that electric power from the power source 25 is dividedly supplied to each of the power supply circuits 27.

Each of the power supply circuits 27 includes an operational amplifier 29 and a sense resistor 30 (first resistor). In the box-side inspection circuit 21, the power source 25, the operational amplifier 29, the sense resistor 30, the probe 18, and the DUT 26 are connected in series in this order. The power source 25 is connected to a non-inverting input terminal of the operational amplifier 2. The operational amplifier 29 amplifies the electric power dividedly supplied to the respective power supply circuit 27 from the power source 25 and supplies the same to the respective DUT 26. In addition, each of the power supply circuits 27 includes a negative feedback channel 32 (first feedback channel) which connects a downstream sense point 31 positioned between the sense resistor 30 and the DUT 26, and an inverting input terminal of the operational amplifier 29, and a positive feedback channel 34 (second feedback channel) which connects an upstream sense point 33 positioned between the operational amplifier 29 and the sense resistor 30 and the non-inverting input terminal of the operational amplifier 29.

The negative feedback channel 32 applies a voltage at the downstream sense point 31, i.e., a voltage between the sense resistor 30 and the DUT 26, to the inverting input terminal of the operational amplifier 29. The positive feedback channel 34 includes a feedback resistor 35 (second resistor) and a switch 36 capable of cutting off the positive feedback channel 34 by an ON/OFF operation. The switch 36 is connected to the switch control part 28. The switch control part 28 controls the ON/OFF operation of the switch 36. Furthermore, the switch 36 normally remains turned off.

In the box-side inspection circuit 21, since the voltage at the downstream sense point 31 is applied to the inverting input terminal of the operational amplifier 29 as described above, the potential of the non-inverting input terminal of the operational amplifier 29 becomes equal to the potential of the inverting input terminal of the operational amplifier 29, i.e., the potential at the downstream sense point 31, by the negative feedback operation.

On the other hand, in the box-side inspection circuit 21, when the switch 36 is turned on, the upstream sense point 33 and the non-inverting input terminal of the operational amplifier 29 are connected to each other. However, since the potential of the non-inverting input terminal of the operational amplifier 29 is equal to the potential at the downstream sense point 31, a voltage drop value at the positive feedback channel 34 becomes equal to a difference between the potential at the upstream sense point 33 and the potential at the downstream sense point 31, namely a voltage drop value at the sense resistor 30. Here, assuming that a resistance value of the sense resistor 30 is $R_1$ (Ω), a current flowing through the sense resistor 30 is $I_1$ (A), a resistance value of the feedback resistor 35 is $R_2$ (Ω), and a current flowing through the feedback resistor 35 is $I_2$ (A), according to Ohm's law, the voltage drop value at the sense resistor 30 becomes $I_1 \times R_1$ (V) and the voltage drop value at the positive feedback channel 34 becomes $I_2 \times R_2$ (V). Thus, the following equation (1) is established.

$$I_1 \times R_1 = I_2 \times R_2 \qquad \text{Eq. (1)}$$

Here, the resistance value $R_1$ of the sense resistor 30 and the resistance value $R_2$ of the feedback resistor 35 are known, and the current (hereinafter, referred to as "feedback current") $I_2$ flowing through the positive feedback channel 34 may be measured using the current measuring function of the power source 25. Therefore, the current flowing through the sense resistor 30, i.e., the current (hereinafter, referred to as "device current") $I_1$ flowing through the DUT 26 may be derived based on the following equation (2).

$$I_1 = I_2 \times R_2 / R_1 \qquad \text{Eq. (2)}$$

From the foregoing, in the box-side inspection circuit 21, it is possible to calculate the device current flowing through the sense resistor 30 without installing a sense amplifier and an AD converter corresponding to each DUT 26. That is to say, it is possible to measure currents flowing through the plurality of DUTs 26 formed on the wafer W without increasing the cost of the prober.

Furthermore, in the box-side inspection circuit 21, the single power source 25 is connected to the non-inverting input terminals of the operational amplifiers 29 of the plurality of power supply circuits 27, and the plurality of power supply circuits 27 are connected to the plurality of DUTs 26 in a one-to-one manner. Thus, electric power can be supplied from the single power source 25 to the plurality of DUTs 26, thereby reducing the number of power sources 25 and further reducing the cost.

In addition, in the box-side inspection circuit 21, the feedback current $I_2$ at the positive feedback channel 34 of each power supply circuit 27 is measured by the current measuring function of the power source 25. Since the single power source 25 is connected to the plurality of power supply circuits 27, there is a possibility that the power source 25 measures a plurality of feedback currents $I_2$ at the same time. However, since the positive feedback channel 34 in each power supply circuit 27 includes the switch 36, it is possible to allow the feedback current $I_2$ to flow only through the respective positive feedback channel 34 by controlling the operation of the switch 36 at each positive feedback channel 34. As a result, it is possible to prevent the power source 25 from simultaneously measuring the plurality of feedback currents $I_2$. In addition, by sequentially turning on the respective switches 36 of the positive feedback channels 34 in the power supply circuits 27, it is possible to sequentially measure the feedback currents $I_2$ in all the power supply circuits 27. As a result, it is possible to calculate the device currents of all the DUTs 26.

Furthermore, in FIG. 4, the single power source 25 is illustrated in the box-side inspection circuit 21 but the number of power sources 25 of the box-side inspection circuit 21 is not limited thereto. Also, in FIG. 4, the three power supply circuits 27 are connected to the single power source 25 but the number of power supply circuits 27 connected to the single power source 25 is not limited thereto.

Next, a second embodiment of the present disclosure will be described.

Since a configuration and operation of the second embodiment are basically identical to those of the aforementioned first embodiment, description of the configuration and operation that overlap with the first embodiment will be omitted, and differences in configuration and operation will be described.

Figure 5:
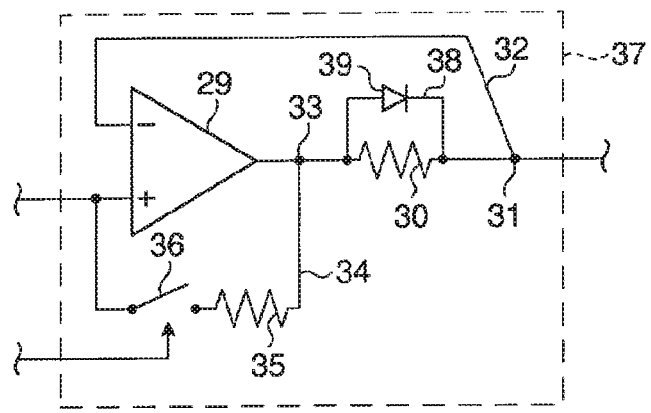
FIG. 5 is a circuit diagram illustrating a configuration of a power supply circuit in a device inspection circuit according to a second embodiment of the present disclosure.

FIG. 5 is a circuit diagram illustrating a configuration of a power supply circuit in a device inspection circuit according to the second embodiment of the present disclosure.

When calculating the device current $I_1$ during a standby state of the DUT 26, since the device current $I_1$ during the standby state is weak, it may be considered that the voltage drop value at the sense resistor 30, namely the voltage drop value at the positive feedback channel 34, becomes small and the feedback current $I_2$ also becomes small. In this case, the measurement accuracy of the feedback current $I_2$ is lowered, and as a result, the calculation accuracy of the device current $I_1$ may be lowered. To address such concerns, it may be considered to set the resistance value $R_1$ of the sense resistor 30 as large as possible. Meanwhile, during the operation of the DUT 26, a larger device current $I_1$ flows than in the standby state. However, setting the resistance value $R_1$ of the sense resistor 30 as large as possible makes it difficult for the device current $I_1$ to flow through the sense resistor 30 and thus sufficient electric power may not be supplied to the DUT 26.

To overcome this problem, in the present embodiment, the power supply circuit 37 includes a bypass channel 38 (avoidance channel) which directly connects the operational amplifier 29 and the DUT 26 by bypassing the sense resistor 30. The bypass channel 38 includes a diode 39 which is connected in parallel with the sense resistor 30. When the voltage drop value at the sense resistor 30, namely a potential difference of the voltage applied to the diode 39, is equal to or higher than a predetermined value, the diode 39 rapidly passes the current. Therefore, when a relatively large device current $I_1$ attempts to pass through the sense resistor 30 during the operation of the DUT 26 and the voltage drop value at the sense resistor 30 becomes large, the device current $I_1$ bypasses the sense resistor 30 and flows through the bypass channel 38 and reaches the DUT 26 as it is. As a result, even when the resistance value $R_1$ of the sense resistor 30 is set as large as possible, a relatively large device current $I_1$ can be allowed to flow toward the DUT 26 via the bypass channel 38 during the operation of the DUT 26. Thus, it is possible to supply sufficient electric power to the DUT 26 under operation.

Next, a third embodiment of the present disclosure will be described.

Since a configuration and operation of the third embodiment are basically identical to those of the aforementioned second embodiment, description of the configuration and operation that overlap with the second embodiment will be omitted, and differences in configuration and operation will be described.

Figure 6:
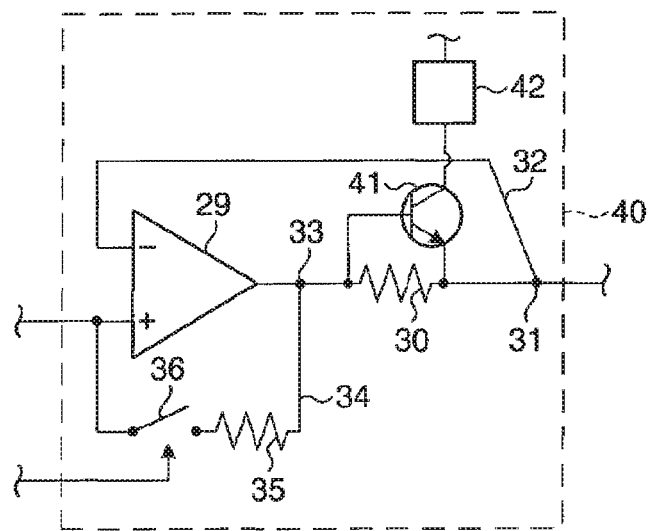
FIG. 6 is a circuit diagram illustrating a configuration of a power supply circuit in a device inspection circuit according to a third embodiment of the present disclosure.

FIG. 6 is a circuit diagram illustrating a configuration of a power supply circuit in a device inspection circuit according to the third embodiment of the present disclosure.

As described in the second embodiment, when the resistance value $R_1$ of the sense resistor 30 is set as large as possible in order to suppress the deterioration in the calculation accuracy of the device current $I_1$ during the standby state of the DUT 26, sufficient electric power may not be supplied to the DUT 26. To address such a concern, in the present embodiment, a power supply circuit 40 includes a transistor 41 which is a bipolar transistor, and an additional power source (other power source) (not shown) which supplies relatively large electric power. A base of the transistor 41 is connected between the operational amplifier 29 and the sense resistor 30, and an emitter of the transistor 41 is connected between the sense resistor 30 and the DUT 26. That is to say, the transistor 41 is arranged in parallel with the sense resistor 30. Therefore, a potential difference equivalent to the voltage drop value at the sense resistor 30 is generated between the base and the emitter of the transistor 41 to allow a base current to flow. Furthermore, the additional power source is coupled to a collector of the transistor 41 via a limiter circuit 42 (current limiting circuit). Therefore, when a relatively large device current $I_1$ attempts to pass through the sense resistor 30 during the operation of the DUT 26 and the voltage drop value at the sense resistor 30 becomes large, the base current flows through the transistor 41 to turn on the transistor 41 and relatively large electric power is supplied from the additional power source to the DUT 26 via the transistor 41. As a result, even when the resistance value $R_1$ of the sense resistor 30 is set as large as possible, sufficient electric power can be supplied to the DUT 26 under operation.

In addition, since the limiter circuit 42 is interposed between the additional power source and the transistor 41, even when the DUT 26 is short-circuited, it is possible to prevent a large current from flowing toward the DUT 26 from the additional power source, and to prevent the DUT 26 from being damaged.

Furthermore, in the power supply circuit 40, the bipolar transistor is used as the transistor 41, but a field effect transistor may be used. In this case, a gate of the transistor 41 is connected between the operational amplifier 29 and the sense resistor 30 and a source of the transistor 41 is connected between the sense resistor 30 and the DUT 26. Also, the additional power source is coupled to a drain of the transistor 41 via the limiter circuit 42.

Next, a fourth embodiment of the present disclosure will be described.

Since a configuration and operation of the fourth embodiment are basically identical to those of the aforementioned first embodiment, description of the configuration and operation that overlap with the first embodiment will be omitted, and differences in configuration and operation will be described.

Figure 7:
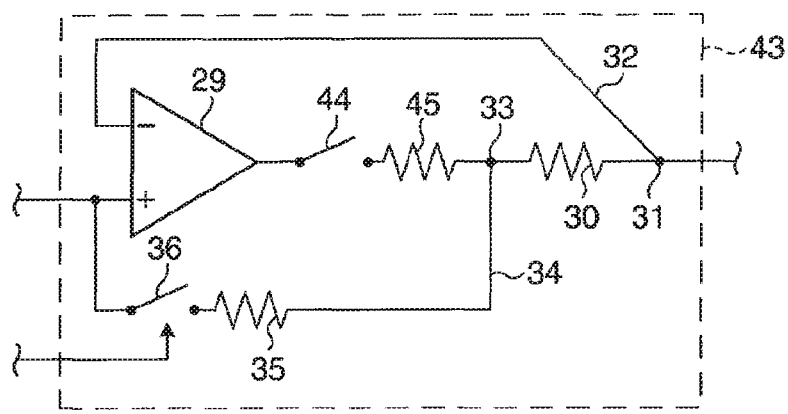
FIG. 7 is a circuit diagram illustrating a configuration of a power supply circuit in a device inspection circuit according to a fourth embodiment of the present disclosure.

FIG. 7 is a circuit diagram illustrating a configuration of a power supply circuit in a device inspection circuit according to the fourth embodiment of the present disclosure.

As described above, in the box-side inspection circuit 21, the single power source 25 dividedly supplies electric power to the plurality of DUTs 26. However, when a malfunction occurs in any one of the plurality of DUTs 26, the DUT 26 may be damaged when the electric power continues to be supplied to the malfunctioned DUT 26. Therefore, it is necessary for the single power source 25 to stop the supply of electric power and then stop the supply of electric power to the malfunctioned DUT 26. However, when the supply of electric power from the single power source 25 is stopped, the supply of electric power to other DUTs 26 is also stopped. As such, it is impossible to inspect the electrical characteristics of other DUTs 26 in which no malfunction occurs. Thus, there is a possibility that the inspection efficiency of each DUT 26 is deteriorated.

To overcome this problem, in the present embodiment, a power supply circuit 43 includes an additional switch 44 (another switch) interposed between the operational amplifier 29 and the sense resistor 30. Therefore, when a malfunction occurs in the DUT 26, it is possible to prevent electric power from being supplied to the malfunctioned DUT 26 merely by turning off the additional switch 44 without stopping the supply of electric power from the power source 25 to other DUTs 26. Thus, it is possible to prevent the electrical characteristics of other DUTs 26 in which no malfunction occurs from being not inspected, and to prevent the deterioration in the inspection efficiency of each DUT 26.

In addition, the power supply circuit 43 includes an auxiliary resistor 45 (third resistor) interposed between the additional switch 44 and the sense resistor 30, and the upstream sense point 33 is positioned between the auxiliary resistor 45 and the sense resistor 30. Therefore, the voltage drop value at the positive feedback channel 34 becomes a difference between a potential lowered by the auxiliary resistor 45 and a potential of the non-inverting input terminal of the operational amplifier 29. That is to say, it is possible to reduce the voltage drop value at the positive feedback channel 34. Thus, for example, it is possible to prevent excessive current from flowing through the positive feedback channel 34 and to prevent abnormal heat from being generated in the feedback resistor 35. Furthermore, in the power supply circuit 43, the auxiliary resistor 45 is connected in series to the operational amplifier 29 in addition to the sense resistor 30. This makes it possible to limit the current flowing through the operational amplifier 29, thereby preventing excessive current from flowing through the operational amplifier 29 and to prevent abnormal heat from being generated in the operational amplifier 29.

In addition, in the power supply circuit 43, the operational amplifier 29, the additional switch 44, the auxiliary resistor 45, and the sense resistor 30 are connected in series in this order, but the connection order of the additional switch 44 and the auxiliary resistor 45 may be changed as long as the upstream sense point 33 is positioned between the auxiliary resistor 45 and the sense resistor 30.

Next, a fifth embodiment of the present disclosure will be described.

Since a configuration and operation of the fifth embodiment are basically identical to those of the aforementioned first embodiment, description of the configuration and operation that overlap with the first embodiment will be omitted, and differences in configuration and operation will be described.

Figure 8:
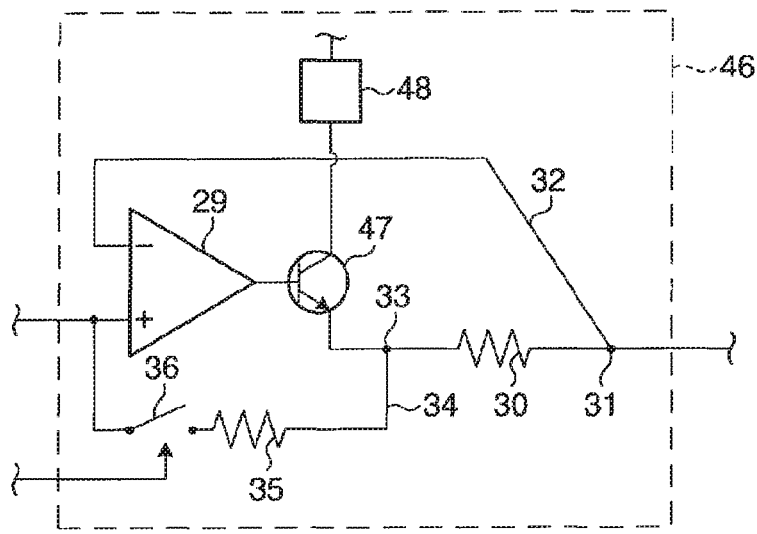
FIG. 8 is a circuit diagram illustrating a configuration of a power supply circuit in a device inspection circuit according to a fifth embodiment of the present disclosure.

FIG. 8 is a circuit diagram illustrating a configuration of a power supply circuit in a device inspection circuit according to the fifth embodiment of the present disclosure.

As described above, in the box-side inspection circuit 21, the single power source 25 dividedly supplies electric power to the plurality of DUTs 26. However, when the number of DUTs 26 to which the single power source 25 supplies electric power is increased, even if sufficient electric power may be supplied to each DUT 26 during the standby state of each DUT 26, there is a possibility that sufficient electric power cannot be supplied to each DUT 26 during the operation of each DUT 26.

To address the above concern, in the present embodiment, a power supply circuit 46 includes a transistor 47 which is a bipolar transistor, and another additional power source (not shown) for supplying relatively large electric power. The transistor 47 is interposed between the operational amplifier 29 and the sense resistor 30. A base of the transistor 47 is connected to the operational amplifier 29 and an emitter of the transistor 47 is connected to the sense resistor 30. Therefore, a base current flows between the base and the emitter of the transistor 41 due to a potential difference between the operational amplifier 29 and the sense resistor 30. In addition, the another additional power source is coupled to a collector of the transistor 47 via a limiter circuit 48. Therefore, when the potential difference between the operational amplifier 29 and the sense resistor 30 is increased to allow a relatively large device current $I_1$ to flow during the operation of the DUT 26, the base current flows through the transistor 47 to turn on the transistor 47, and relatively large electric power is supplied from the another additional power source to the DUT 26 via the transistor 47. As a result, even when the single power source 25 dividedly supplies electric power to the plurality of DUTs 26, sufficient electric power can be supplied to each DUT 26 under operation.

Furthermore, in the power supply circuit 46, the bipolar transistor is used as the transistor 47, but a field effect transistor may be used. In this case, a gate of the transistor 47 is connected to the operational amplifier 29 and a source of the transistor 47 is connected to the sense resistor 30. In addition, the another additional power source is coupled to a drain of the transistor 47 via the limiter circuit 48.

While the present disclosure has been described above with reference to the respective embodiments, the present disclosure is not limited to the respective embodiments.

Figure 9:
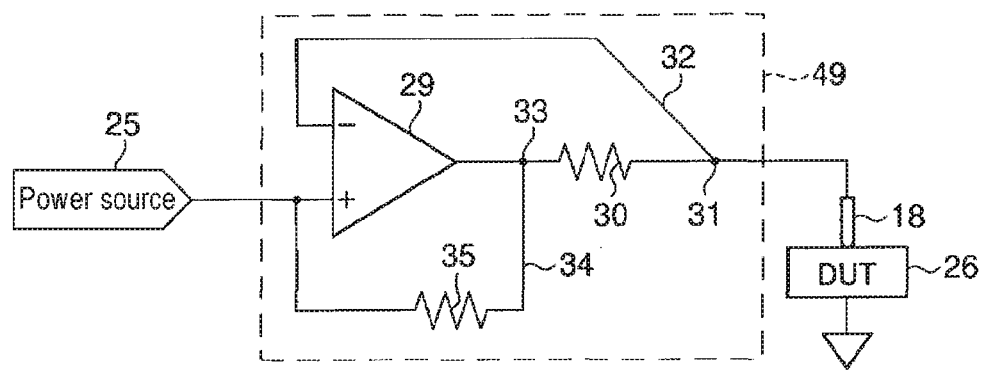
FIG. 9 is a circuit diagram illustrating a configuration of a power supply circuit in a case where electric power is supplied from a single power source to a single DUT.
Figure 10:
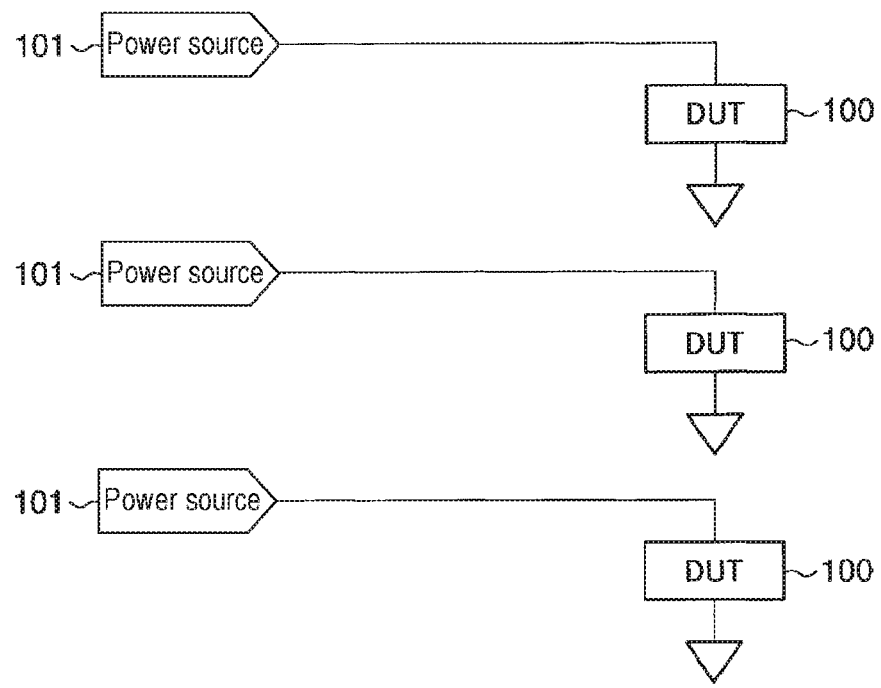
FIG. 10 is a circuit diagram illustrating a correspondence relationship between power sources and DUTs in a conventional prober.
Figure 11:
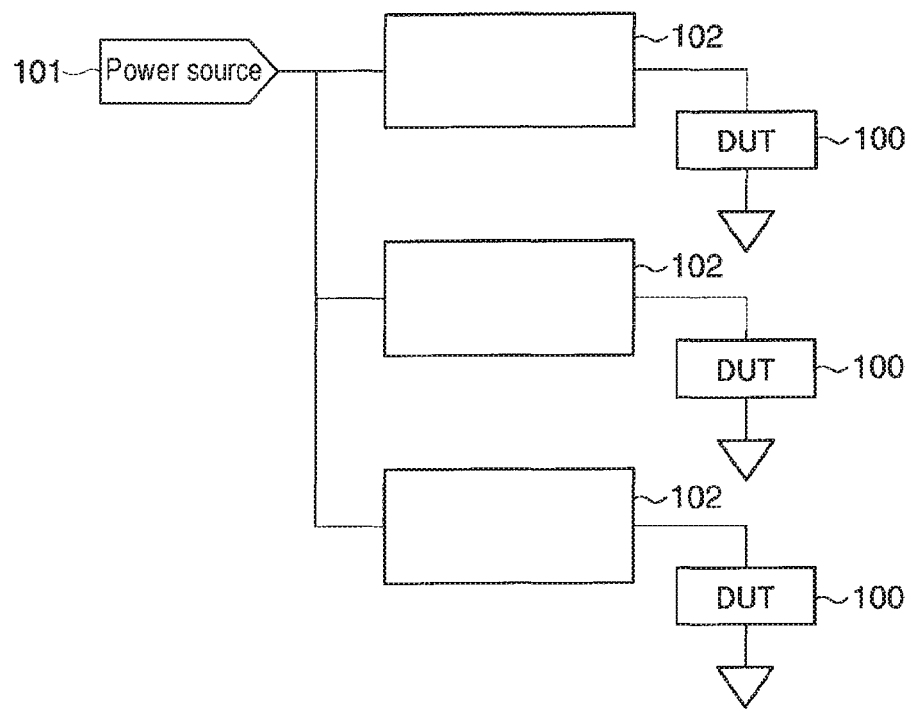
FIG. 11 is a circuit diagram illustrating a correspondence relationship between a single power source and a plurality of DUTs in a case where electric power is supplied from the single power source to the plurality of DUTs.
Figure 12:
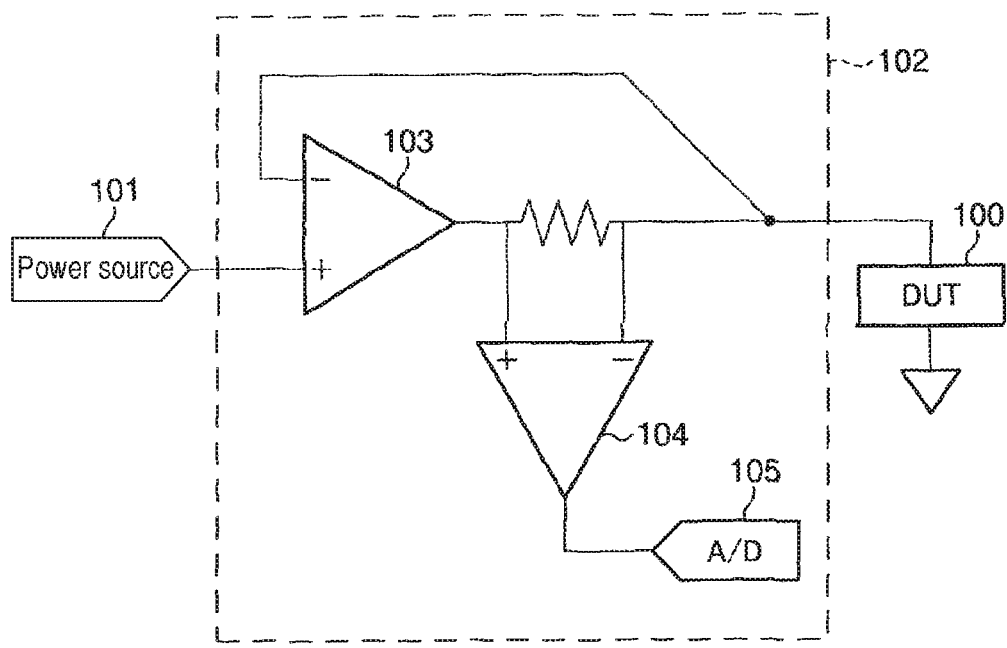
FIG. 12 is a circuit diagram illustrating a configuration of a conventional power supply circuit in a case where electric power is supplied from a single power source to a plurality of DUTs.

For example, even if electric power is supplied from a single power source 25 to a single DUT 26, when the electric power supplied from the single power source 25 is small, the electric power may be amplified by using the operational amplifier 29. Also in this case, a power supply circuit 49 having substantially the same configuration as the power supply circuit 40 may be used. There is no possibility that the single power source 25 measures a plurality of feedback currents $I_2$ at the same time. Thus, in the power supply circuit 49, it is unnecessary to install the switch 36 in the positive feedback channel 34 and also unnecessary to install the switch control part 28, as illustrated in FIG. 9. Thus, it is possible to simplify the configuration of the power supply circuit 49 compared with that of the power supply circuit 40.

Furthermore, while in the respective embodiments described above, the power supply circuit 27 (37, 40, 43, 46, or 49) has been described to be installed in the box-side inspection circuit 21 of the test box 14, the power supply circuit 27 (37, 40, 43, 46, or 49) may be installed in the card-side inspection circuit 19 of the probe card 15.

This application claims priority based on Japanese Patent Application No. 2016-158906 filed on Aug. 12, 2016, the entire contents of which are incorporated herein by reference.

EXPLANATION OF REFERENCE NUMERALS

W: wafer, 10: prober, 14: test box, 15: probe card, 19: card-side inspection circuit, 21: box-side inspection circuit, 25: power source, 26: DUT, 27, 37, 40, 43, 46 and 49: power supply circuit, 29: operational amplifier, 30: sense resistor, 32: negative feedback channel, 33: upstream sense point, 34: positive feedback channel, 35: feedback resistor, 36: switch, 38: bypass channel, 41 and 47: transistor, 42 and 48: limiter circuit, 44: additional switch, 45: auxiliary resistor

What is claimed is:

1. A device inspection circuit comprising at least one power source having a current measuring function, an operational amplifier and a first resistor, wherein the at least one power source, the operational amplifier, the first resistor and at least one device are connected in series in this order, and the at least one power source is connected to a non-inverting input terminal of the operational amplifier, the device inspection circuit further comprising:

a first feedback channel configured to apply a voltage between the first resistor and the at least one device to an inverting input terminal of the operational amplifier; and a second feedback channel configured to connect a point between the operational amplifier and the first resistor and the non-inverting input terminal of the operational amplifier, wherein the second feedback channel includes a second resistor installed therein, the circuit further comprising a plurality of power supply circuits, each of which is constituted by the operational amplifier, the first resistor, the first feedback channel and the second feedback channel, wherein the at least one power source includes a single power source connected to the non-inverting input terminal of the operational amplifier of each of the plurality of power supply circuits, the at least one device includes a plurality of devices, and the plurality of power supply circuits is connected to the plurality of devices in a one-to-one manner.

2. The circuit of claim 1, wherein in each of the plurality of power supply circuits, the second feedback channel includes a switch.

3. The circuit of claim 1, further comprising an avoidance channel configured to directly connect the operational amplifier and the device while bypassing the first resistor.

4. The circuit of claim 1, wherein the at least one power source includes another power source, and the device inspection circuit further comprises a transistor,
wherein the another power source is coupled to the at least one device via the transistor, and the transistor is arranged in parallel with the first resistor.

5. The circuit of claim 4, wherein a current limiting circuit is interposed between the another power source and the transistor.

6. The circuit of claim 1, wherein another switch is interposed between the operational amplifier and the first resistor.

7. The circuit of claim 1, wherein a third resistor is interposed between the operational amplifier and the first resistor, and the second feedback channel is configured to connect a point between the third resistor and the first resistor and the non-inverting input terminal of the operational amplifier.

8. A device inspection device for inspecting electrical characteristics of a device, comprising a device inspection circuit including a power source having a current measuring function, an operational amplifier and a first resistor, wherein the power source, the operational amplifier, the first resistor and the device are connected in series in this order, and the power source is connected to a non-inverting input terminal of the operational amplifier,
wherein the device inspection circuit further includes:
a first feedback path configured to apply a voltage between the first resistor and the device to an inverting input terminal of the operational amplifier; and
a second feedback channel configured to connect a point between the operational amplifier and the first resistor and the non-inverting input terminal of the operational amplifier,
wherein the second feedback channel includes a second resistor installed therein, the circuit further comprising a plurality of power supply circuits, each of which is constituted by the operational amplifier, the first resistor, the first feedback channel and the second feedback channel, wherein the at least one power source includes a single power source connected to the non-inverting input terminal of the operational amplifier of each of the plurality of power supply circuits, the at least one device includes a plurality of devices, and the plurality of power supply circuits is connected to the plurality of devices in a one-to-one manner.

9. A probe card which comprises an operational amplifier, a first resistor and a probe, and inspects electrical characteristics of a device by bring the probe into contact with the device,
wherein a power source having a current measuring function, the operational amplifier, the first resistor, the probe and the device are connected in series in this order, and the power source is connected to a non-inverting input terminal of the operational amplifier,
wherein the probe card further comprises:
a first feedback path configured to apply a voltage between the first resistor and the device to an inverting input terminal of the operational amplifier; and
a second feedback channel configured to connect a point between the operational amplifier and the first resistor and the non-inverting input terminal of the operational amplifier,
wherein the second feedback channel includes a second resistor installed therein, the circuit further comprising a plurality of power supply circuits, each of which is constituted by the operational amplifier, the first resistor, the first feedback channel and the second feedback channel, wherein the at least one power source includes a single power source connected to the non-inverting input terminal of the operational amplifier of each of the plurality of power supply circuits, the at least one device includes a plurality of devices, and the plurality of power supply circuits is connected to the plurality of devices in a one-to-one manner.

* * * * *